(12) United States Patent
Lvovsky et al.

(10) Patent No.: US 6,570,475 B1
(45) Date of Patent: May 27, 2003

(54) SPLIT TYPE MAGNETIC RESONANCE IMAGING MAGNET

(75) Inventors: Yuri Lvovsky, Clifton Park, NY (US); Robert E. Wilcox, Westerlo, NY (US); A. Kamal Kalafala, Albany, NY (US); Leo Blecher, Niskayuna, NY (US)

(73) Assignee: Intermagnetics General Corp., Latham, NY (US)

( * ) Notice: Subject to any disclaimer, the term of this patent is extended or adjusted under 35 U.S.C. 154(b) by 0 days.

(21) Appl. No.: 09/716,765

(22) Filed: Nov. 20, 2000

(51) Int. Cl.⁷ .............................. G01V 3/00; H01F 6/06
(52) U.S. Cl. ...................... 335/216; 335/299; 335/301; 324/319; 324/320
(58) Field of Search .............................. 335/216, 299, 335/301; 324/318, 319, 320

(56) References Cited

U.S. PATENT DOCUMENTS

| 5,818,319 A | 10/1998 | Grozier et al. .............. 335/299 |
| 5,874,880 A | 2/1999 | Laskaris et al. ............. 335/216 |
| 5,883,558 A | 3/1999 | Laskaris et al. ............. 335/216 |
| 5,936,498 A | 8/1999 | Takeshima et al. ......... 335/216 |
| 5,982,260 A | * 11/1999 | Byrne ........................ 324/319 |
| 5,994,991 A | 11/1999 | Laskaris et al. ............. 355/299 |
| 2002/0050820 A1 | 5/2002 | Overweg |
| 2002/0072666 A1 | 6/2002 | Overweg et al. |

* cited by examiner

Primary Examiner—Ramon M. Barrera
(74) Attorney, Agent, or Firm—Katten Muchin Zavis Rosenman (57) ABSTRACT

An MRI magnet assembly includes a pair of cryostat enclosures each housing a superconducting primary shield coil. The primary shield coil is dimensioned with an outer diameter greater than that of the main coil and is axially spaced away from the magnet pole significantly farther than is the main coil. This design provides for increased accessibility and visibility within the gap defined between the cryostat enclosures, and allows for reduced amounts of superconducting material in the coils. A set of field shaping coils is mounted radially inwardly and closely axially adjacent to the magnet pole and axially between the main coil and the shield coil.

29 Claims, 5 Drawing Sheets

SPLIT TYPE MAGNETIC RESONANCE IMAGING MAGNET

BACKGROUND OF THE INVENTION

1. Field of the Invention

The present invention relates in general to split type or open superconducting magnets for magnetic resonance imaging (MRI), and in particular to such magnets having large diameter shield coils remotely spaced from the magnet poles.

2. Description of Prior Developments

Split type or "open" superconducting magnets are used in magnetic resonance imaging (MRI) scanners to produce magnetic fields required for patient imaging. Superconducting shield coils are typically used in each half of the split magnets to reduce stray electromagnetic fields. This type of shielding is referred to as active shielding.

A typical design of an actively shielded superconducting split type open MRI magnet assembly includes two generally cylindrical enclosures. A lower cylindrical enclosure and an upper cylindrical enclosure are interconnected by structural supports. Cryogenic and electrical connections are also provided between these enclosures or "halves".

The opposing cylindrical enclosures form two magnetic poles separated by a gap which contains an imaging region where a patient is imaged. Each enclosure contains several superconducting coils placed inside a liquid helium vessel. The helium vessel is located within a vacuum vessel and maintains the magnet at an operating temperature of about 4 K. The coils contained in the helium vessel are arranged in location as well as in magnetic polarity via the direction of the current they carry, so that they produce a substantially uniform field in a portion of the gap formed between the two enclosures while limiting the stray field outside the device to an acceptable level.

Each enclosure also includes one or more thermal shields as well as thermal insulation, located between the helium vessel and the vacuum vessel to keep heat leak to the 4 K environment within acceptable levels. The uniform internal field is produced by a main superconducting coil and several field shaping coils. In addition, one or more shield coils, are spaced away from the gap to reduce stray field released outside of the MRI scanner.

Sizing and positioning of the coils is done by those skilled in the art by using numerical codes based on static magnetic field equations, with the objective to achieve both the targeted field uniformity inside the imaging region, e.g. through minimizing terms in the Legendre polynomial series, and restricted stray field, e.g. through minimizing external field moments. Although the location and size of the coils cannot be defined arbitrarily, there is some freedom in positioning the coils, and different positions result in different amounts of conductor required for given uniformity and stray field requirements.

A significant advantage of a split type MRI magnet and scanner is the openness of the gap which is formed between the magnet poles. The open gap provides an enhanced view of the patient in the imaging region and allows medical personnel to directly access the patient as the patient is positioned within the gap.

Efforts are being made to increase the gap size to improve patient comfort, visibility and accessibility and to reduce the diameter of the magnet poles to further increase patient comfort, visibility and accessibility. Different magnet designs with different gap configurations can be produced within different envelopes yet provide the same field strength and field uniformity.

Such designs may require different aggregate amounts of superconducting material or "conductor" contained in the various coil designs. The conductor is usually the largest single cost item in an MRI magnet assembly, so it is desirable to minimize the amount of conductor required to produce a given field strength and uniformity.

Moreover, the designs with a larger conductor volume usually result in a higher peak field, $B_{peak}$, and greater accompanying mechanical stress in the coils. These two parameters gradually increase with conductor volume until the risk of design failure becomes unacceptable. Peak field and stresses have a major impact on the progress of future open MRI designs with a target of high field exceeding 1T.

Accordingly, each split-type magnet design represents a compromise between its openness, which is related to gap size and pole diameter, its cost and its operating structural safety margins. Generally, for a given field strength, uniformity and stray field, the larger the maximum diameter of the magnet coils and/or the smaller the patient imaging gap, the lower is the amount of conductor required and the lower is the cost and structural risk of the magnet design. However, these potential cost reducing approaches can result in decreased patient comfort, visibility and accessibility.

Accordingly, a continuing need exists for a split type MRI magnet which provides improved openness through a large split and small diameter pole, yet which requires less superconducting material and which reduces the associated field and stress in a relatively lightweight superconducting magnet, while satisfying stringent uniformity and stray field requirements.

SUMMARY OF THE INVENTION

The present invention has been developed to fulfill the needs noted above and therefore has as an object the provision of an open or split type MRI magnet which provides improved openness or gap size, yet which reduces the total or aggregate amount of superconducting material required, and which also reduces the field and stress within the magnet coils under stringent requirements of uniformity and stray field.

A further object is to provide such a magnet with flattened or axially shortened main coils to reduce the amount of conductor material required and to reduce the amount of stress produced in the main coils.

Yet another object of the invention is to provide a split type MRI magnet with axially stepped field shaping coils to facilitate coil winding and to allow for the use of a single stepped coil support form.

Another object of the invention is to provide a split type MRI magnet with a series of field shaping coils located closely adjacent to the magnet poles and imaging gap.

Still a further object of the invention is to provide a split type MRI magnet having field shaping coils positioned radially outside of a recess formed in the magnet pole of a cryostat enclosure.

The above and additional objects are met by the present invention which is directed to an open split type superconducting magnet for an MRI scanner which uses superconducting shielding coils, with optional external iron shielding, to reduce stray magnetic fields. In accordance with the invention, the primary shield coil, i.e., that shield coil typically with the largest diameter having its current flowing opposite or negative with respect to the current in the main coil, can have a substantially greater axial distance from the imaging gap and advantageously has a substantially larger diameter than the main coil. The larger diameter of the shield coil does not affect the patient's perception of openness as it has no effect on the patient's field of view from the patient's bed.

The main purpose of the negative primary shield coil is to compensate the external stray field produced outside of the magnet by the positive main coil and other coils. By doing so, the primary shield coil inevitably reduces the inner field in the imaging region, so the other coils have to grow in order to compensate this negative change. Contribution of the shield coil to the external field is determined by its magnetic moment, which grows as the square of its diameter. The shield coil of a larger diameter produces similar stray field with less ampere-turns and a reduction of the central field cancellation, hence it requires less conductor in other coils and in the whole magnet. More distant axial and radial positioning of the shield coil from the imaging gap additionally results in a smaller negative contribution in the imaging region, which further reduces the amount of conductor required for other coils.

This increased diameter of the primary shield coil can be carried out in either or both halves of the split magnet enclosure. Such a placement of the primary negative shield coil allows the main positive coil to have a smaller outer diameter while using the same amount of superconducting material, and while producing the same peak field and stress level in the conductor coils as in a main coil having a larger diameter. A smaller main coil can provide better gap openness which in turn provides for better patient comfort, visibility and accessibility.

As a result of increasing the outer diameter of the primary shield coil to a diameter greater than the outer diameter of the main coil, the outer shape or envelope of one or both halves of the magnet enclosures can be frustoconical, barrel shaped or "top hat" shaped. Each of these shapes leads to a considerably smaller pole diameter at the expense of a larger central or top diameter on the respective half enclosure.

When a magnet enclosure is formed with a frustoconical shape or a barrel shape, the outer diameter of the pole formed by the cryostat enclosure is reduced and is positioned closer to the outer diameter of the main coil. One or both halves of the magnet enclosures may have an axial recess formed in the central portion of the magnet poles to accommodate gradient coils and/or RF coils. These design features provide better visibility and accessibility of the gap between the magnet poles and result in greater gap openness and patient comfort.

Accordingly, the present invention provides the same or greater gap openness while reducing the amount of conductor material required and while reducing the field and stress in a relatively lightweight superconducting magnet. To fully achieve these results, the outer diameter of the largest or "primary" shield coil is extended radially beyond the outer diameter of the main coil.

This placement of the primary shield coil reduces the amount of conductor material, coil field and coil stress compared with an open magnet having a conventional cylindrical enclosure and having a main coil with the same outer diameter. The conical surface of the vacuum vessel near the pole, enabled by and arising from such placement of the primary shield coil, also allows the outer diameter of the vacuum vessel pole to be reduced to a size closer to that of the main coil as compared with a magnet having a cylindrical enclosure, while keeping the necessary clearance between the 4 K helium vessel and the outer vacuum vessel the same.

The openness of the gap between the poles is not seriously affected by an enlarged shield coil because of the axial spacing of the shield coil remotely away from the gap which retains the same patient's field of view. The comparison noted above assumes that the outer diameter of the main coil is kept the same as that of a conventional cylindrical magnet enclosure, but that the amount of conductor material (and cost of material) is reduced. However, considering the trade off between the amount of conductor material required and the pole diameter, a magnet designer can now reduce the outer diameter of the main coil while keeping the amount of coil material the same. This results in a more open gap and a magnet having a similar cost and reliability as conventional cylindrical designs.

Another feature of the invention is the placement of one and preferably two or more magnetic field shaping coils at a position closely axially adjacent to a magnet pole and imaging gap. The closer the field shaping coils are located to the magnet pole, the less superconducting coil material is required to produce the desired effect.

In one embodiment, the field shaping coils are arranged in substantial radial alignment on an inner wall of the magnet enclosure so that the axial spacing of these coils from the imaging gap is minimized. This radial coplanar or "planetary" arrangement of coils reduces the amount of conductor material required as compared to field shaping coils located axially further away from the magnet pole and imaging gap.

However, such planetary positioning of coils can pose coil winding problems and may necessitate a slight axial staggering of these field shaping coils to facilitate coil winding. This can be accomplished by using axially and radially stepped winding bobbins or mandrels. Axial spacing of the field shaping coils from the gap should be minimized to reduce the amount of conductor material required.

It is possible to separately wind the coils on individual bobbins and then mount them in machined grooves in the magnet enclosure, and in particular, in the inner wall of the helium vessel mounted within the enclosure. It is also possible to form bobbin or coil support structures within the enclosure, such as on the inner wall of the helium vessel, and wind the coils in place on the helium vessel.

A particularly advantageous design positions the main coil and primary shield coil as noted above, and further positions the field shaping coils radially inwardly of the main coil and axially inwardly of the primary shield coil. Preferably, the field shaping coils are positioned axially between the main field coil and the primary shield coil.

The aforementioned objects, features and advantages of the invention will, in part, be pointed out with particularity, and will, in part, become obvious from the following more detailed description of the invention, taken in conjunction with the accompanying drawings, which form an integral part thereof.

BRIEF DESCRIPTION OF THE DRAWINGS

In the drawings.

In the various figures of the drawing, like reference numerals designate like or similar parts.

DETAILED DESCRIPTION OF THE PREFERRED EMBODIMENTS

The present invention will now be described in conjunction with the drawings, beginning with FIG. 1 which schematically shows a section through an actively shielded superconducting split type open MRI magnet assembly 10 constructed in accordance with the invention. Magnet assembly 10 includes two cryostat magnet enclosures or half assemblies. An upper enclosure 12 is concentrically aligned with a lower enclosure 14 along a central axis 16.

Figure 1:
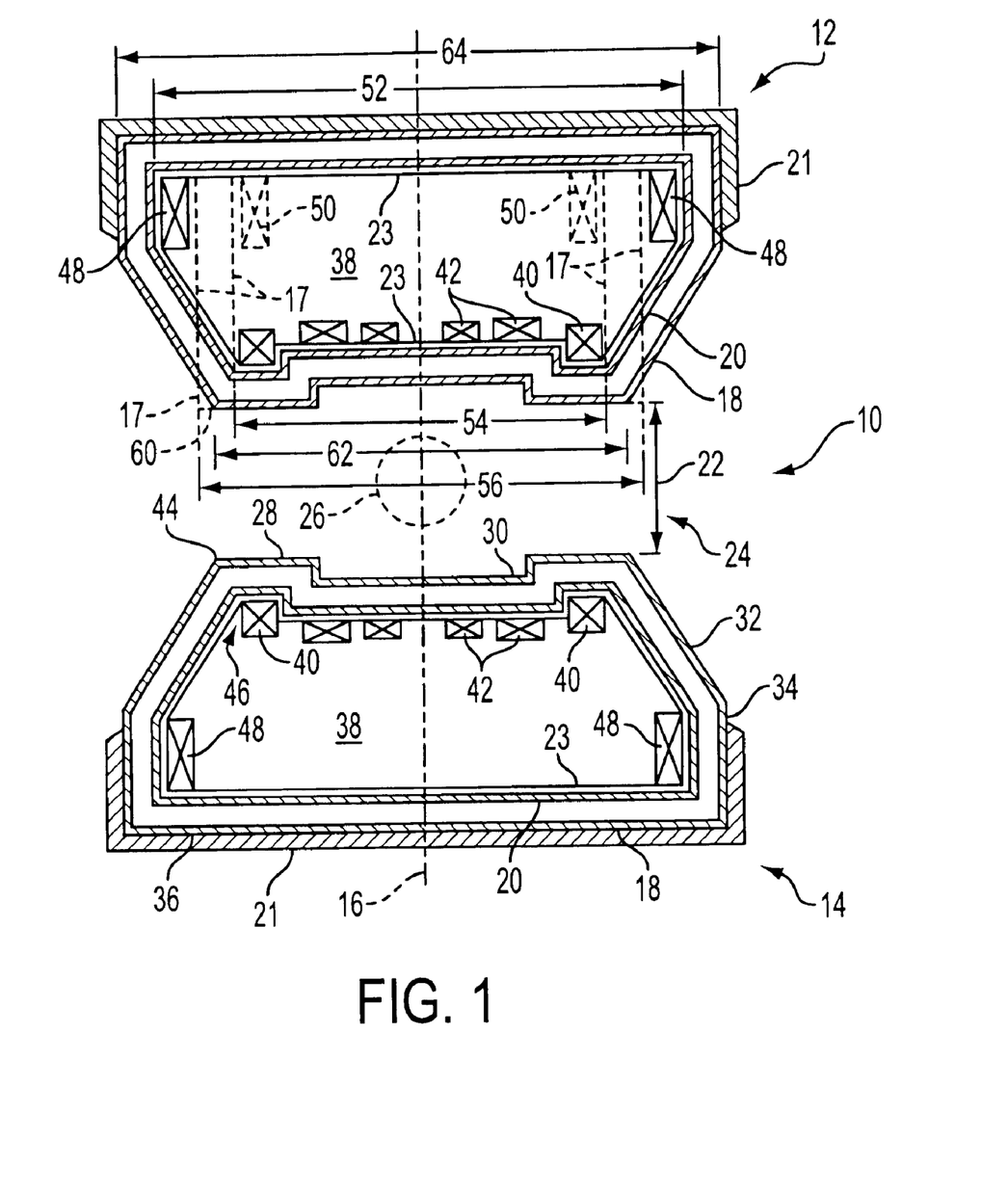
FIG. 1 is a schematic view in central axial section through both halves of a split type open MRI magnet enclosure constructed in accordance with the invention.

FIG. 1 schematically shows an implementation where the upper and lower halves are symmetric and have substantially the same structure. However, the invention may be practiced by using only one enclosure designed as shown in combination with a different magnet enclosure. The dashed lines 17 in FIG. 1 identify the concentric walls of a conventional cylindrical MRI enclosure with coils 50 representing the typical location of a primary shield coil in such an enclosure.

It is also within the scope of the invention to form the two halves of the assembly with the same shape (i.e. conical) but with different dimensions, i.e. outer diameter, height and/or recess. Another design option according to the invention is to form the half envelopes as identical envelopes, but the number of coils and coil locations in each of them are different. Another implementation can have the same shape envelopes but with different envelope dimensions, and different coil positions.

For the sake of clarity, the well known mechanical, electrical and cryogenic connections between and inside the enclosures 12, 14 are removed to emphasize the relative positioning of the superconducting coils within the enclosures. To further clarify the invention, only the outer cryostat envelopes are depicted. That is, only the 300 K outer container 18 and an inner 4 K helium vessel 20 are shown.

Optionally, ferromagnetic shielding elements 21 can be provided as part of the outer vacuum vessel 18 to provide additional shielding of stray field. In addition, or instead of forming vessel 18 with ferromagnetic portions, separate ferromagnetic shielding elements 21 can be mounted in the room outside of the vacuum vessel 18.

As further shown schematically in FIG. 1, a coil envelope 23 is spaced a small distance from the inner surface of the helium vessel 20. This spacing is required for electrical insulation and mechanical and structural considerations. For the sake of clarity, even though envelope 23 is typically present, it is not shown in detail the remaining figures, which simply show the magnet coils spaced slightly from the inner vessel 20 or simply on the inner vessel 20. It is the relative positioning of the magnet coils to which the invention is directed.

The enclosures 12, 14 are axially separated and spaced apart from one another over an axial dimension 22 which represents the size or opening of a patient gap 24 which extends between the enclosures. As noted above, it is desirable to increase the size of opening dimension 22 to increase the comfort of a patient being imaged within gap 24. A patient is typically positioned within gap 24 such that imaging is carried out within a uniform field or field of view 26, as shown by the circle outlined in dashed lines.

Each enclosure 12, 14 has a generally circular inner end face that forms a magnetic pole 28 which faces and borders gap 24. An axial recess or step 30 may be formed in a central portion of each pole 28 to accommodate gradient coils and/or RF coils. The exact shape and volume of the recess 30 is determined by the requirements for gradient and RF coils. Improvements in the shape and volume of the recess by adjustment of corresponding positions of the field shaping coils can allow a designer to optimize gradient coil and RF coil performance. A frustoconical side wall 32 extends radially outwardly and axially away from each pole 28. Each side wall 32 transitions into an outer cylindrical side wall 34 which ends at a circular outer end face 36, which may be flat, dome-shaped or any other suitable shape.

An interior chamber 38 of the helium vessel located within each enclosure 12, 14 contains a set of superconducting coils maintained in liquid helium at about 4 K. A uniform internal field is produced by contributions from main coils 40, several field shaping coils 42 and primary shield coils 48.

Each main coil 40 is positioned against or adjacent to the corner 44 formed between the radially outer circumferential edge of pole 28 and the axially and radially inner circumferential edge of frustoconical side wall 32. The main coils 40 are positioned within each enclosure 12, 14 as close to gap 24 as possible. If a recess 30 is formed in a pole 28, an internal annular pocket 46 is formed in chamber 38. The main coil 40 may then be nested within pocket 44.

At least one shield coil 48 is mounted in each enclosure 12, 14. The shield coils 48 typically have electrical current flowing through them in a direction opposite or "negative" to that of the current flowing through the main coils 40. This reduces the stray fields which are released outside of the magnet assembly 10.

There are significant advantageous features about the particular location and size of the shield coils 48 as depicted in FIG. 1. First, each shield coil 48 is spaced axially remotely away from the gap 24 and axially remotely away from the respective main coils 40. In FIG. 1, the primary shield coils 48, i.e., those typically having the largest diameter with relative negative current flow, are mounted against the cylindrical side wall of the inner vessel envelope 20 and against or adjacent to the circular outer end face 36 of the inner vessel envelope 20. Second, and more importantly, the outer diameter 52 of the primary shield coil 48 is dimensioned greater than the outer diameter 54 of the main coil 40. By locating this larger diameter shield coil 48 axially substantially farther from the gap 24 than the main coil 40, all of the advantages noted above may be realized.

In particular, the amount of superconducting material required is reduced along with the field and stress induced in the coils as compared with the cylindrical magnet enclosure 17 having a primary shield coil 50 formed with the same diameter as that of the main coil 40. Moreover, this remotely spaced larger diameter shield coil 48 allows the outer diameter 56 of a conventional cylindrical cryostat pole 60 to be radially reduced to the smaller diameter 62 of pole 28 located at the smaller truncated inner end of a frustoconical cryostat wall.

This reduction in pole diameter is brought about by the axially inwardly tapering side walls of the enclosures 12, 14 as compared to the fixed diameter side walls of a conventional cylindrical enclosure 17. The reduced pole diameter is still subject to the need to preserve a certain minimal clearance between the inner helium vessel and the outer vacuum vessel, required for the placement of thermal shields and thermal insulation. The openness of gap 24 is not affected by the larger diameter 64 of the end face 36 (as compared to the outer diameter of a cylindrical enclosure). This is because of the significant axial spacing of the main shield coil 48 from the gap 24.

Figure 2:
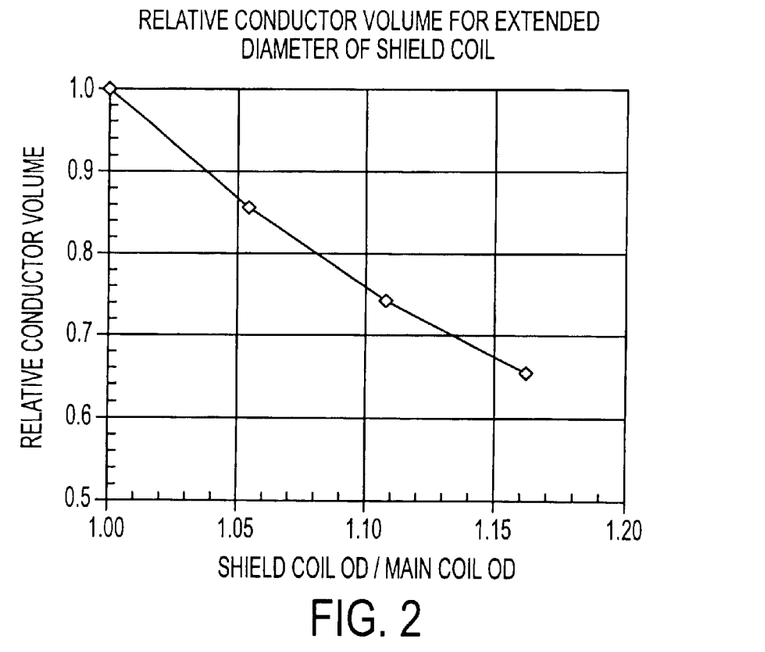
FIG. 2 is a plot of the relative volume of superconducting wire required to produce the same field as that of a conventional cylindrical split magnet having a main coil with the same outer diameter, as a function of the ratio of the outer diameter of the primary shield coil to the outer diameter of the main coil.
Figure 3:
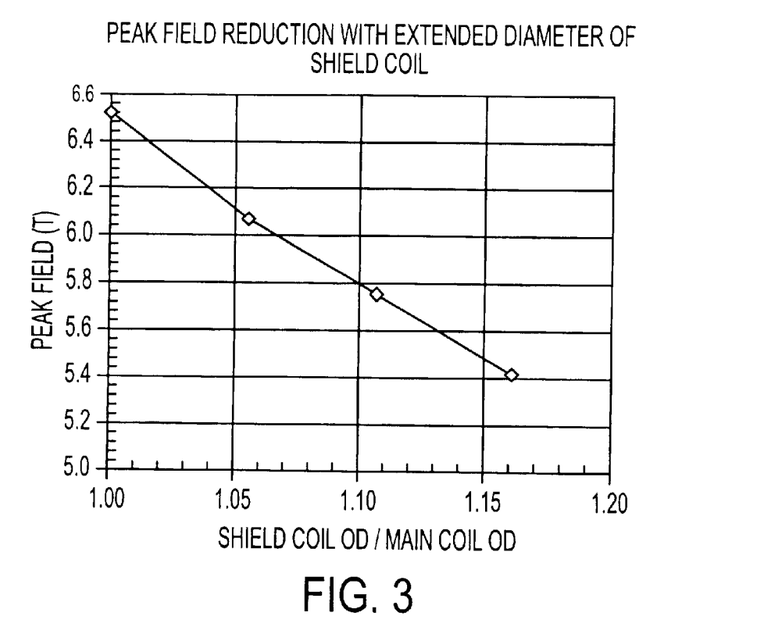
FIG. 3 is a plot of the peak field produced in a superconducting coil as a function of the ratio of the outer diameter of the primary shield (negative) coil to the outer diameter of the main (positive) coil.

The advantages of this design are made evident by the plots of FIGS. 2 and 3. In each plot, as the outer diameter of the main shield coil 48 increases relative to and beyond the outer diameter of the main coil 40, less superconducting coil material is required for each respective magnet assembly 10, (FIG. 2) and less peak field and associated stress are produced in the coils (FIG. 3). Accordingly, to keep the amount of conductor, the peak field and stresses at the same level as in a cylindrical enclosure, the designer now can further reduce the diameter of the main coil 40 and pole diameter 62, which will result in yet greater openness of the system.

Figure 4:
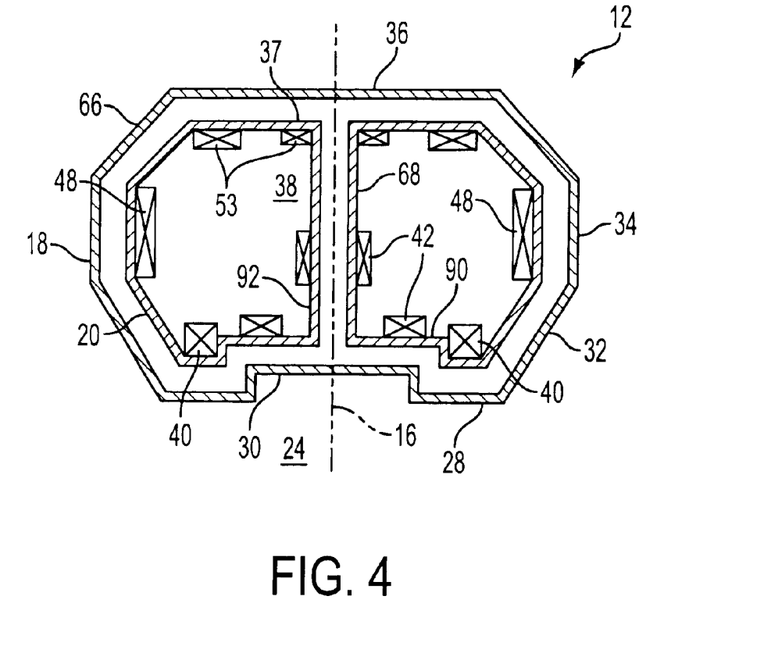
FIG. 4 is a schematic view in central axial section through the upper half enclosure of an MRI magnet constructed in accordance with a second embodiment of the invention with a barrel-type profile.

The invention may be practiced with cryostat enclosures having shapes other than those shown in FIG. 1. For example, as seen in FIG. 4, the upper half of an MRI magnet assembly similar to that of FIG. 1 includes an enclosure 12 having the same inner shape as that of FIG. 1, including pole 28, and walls 32 and 34. In addition, a second generally frustoconical wall 66 tapers radially inwardly and axially outwardly from the central cylindrical wall 34 toward an axially outer circular end face 36.

Although cryostat walls 32, 34 and 66 as well as end face 36 and recess 30 are depicted in section as planar walls, they may also be formed as curved or arcuate walls to form smooth curved shapes such as domes. That is, the enclosures 12, 14 may be designed as domes, half spheroids, or other smooth walled forms. A central tubular chimney 68 serves as a mandrel 92 on which one or more coils 42 can be mounted.

As further seen in FIG. 4, one or more secondary shield coils 53 are mounted on the interior end face 37 of the helium vessel. These shield coils are used for finely controlling the containment of stray field and may be of either polarity. The diameter of the secondary shield coils 53 can be either greater than, equal to or less than the diameter of the main coil 40.

Figure 5:
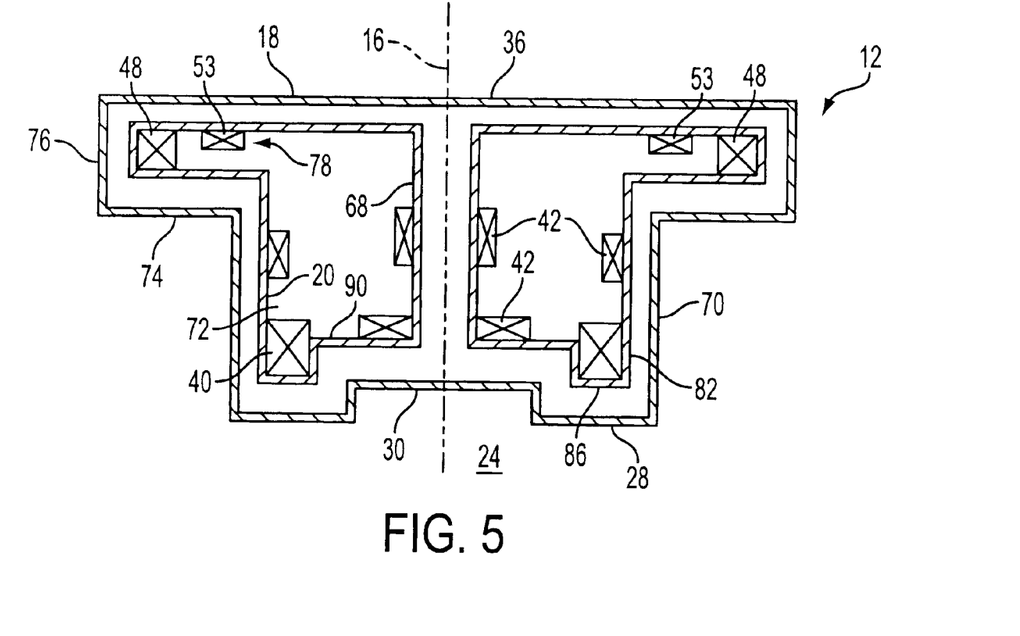
FIG. 5 is a view similar to FIG. 4 showing a third embodiment of the invention wherein a vacuum vessel enclosure is designed with a "top hat" profile.

Another design of a cryostat magnet enclosure is shown in FIG. 5 wherein an upper half of a split magnet enclosure is shaped as an inverted "top hat". In this design, the enclosure 12 is formed with a circular pole surface 28 facing gap 24. A circular or other shaped recess or axial step 30 may be provided in pole surface 28 as noted above, and an internal chimney 68 may be provided as noted above regarding FIG. 4.

A cylindrical side wall 70 extends axially outwardly from pole 28 and away from gap 24 so as to define an inner cylindrical chamber potion 72. Side wall 70 transitions into a radially outwardly stepped wall 74. A second cylindrical wall 76 extends axially outwardly from wall 74 to meet with circular top or outer end face 36.

Walls 74 and 76, together with the radially outer portion of end face 36 form an annular channel 78 having an outer diameter greater than that of the inner cylindrical chamber portion 72. The primary shield coil 48 is mounted in channel 78 and the main coil 40 is mounted in the inner cylindrical chamber portion 72.

In each of the examples of FIGS. 1, 4 and 5, the outer diameter of the primary shied coil 48 is dimensioned greater than that of the main coil 40, and is spaced axially outwardly further from gap 24 than is main coil 40.

Figure 6:
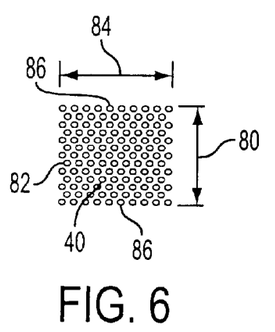
FIGS. 6, 7 and 8 are axial views in section, through main coils constructed in accordance with the invention.
Figure 7:
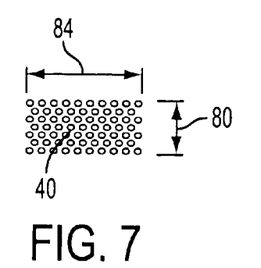
Figure 8:
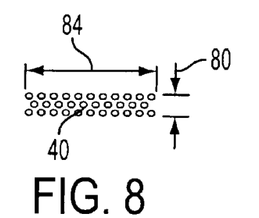

Further refinements of the invention are shown in FIGS. 6, 7 and 8 wherein an axial section through main coil 40 discloses a generally rectangular section having an axial dimension 80 along axial faces 82 and a radial dimension 84 along radial faces 86. In accordance with the invention, it is desirable to shape the cross section of the main coil 40 with an axially flattened profile. These "squashed" or "pancake shaped" main coils require less superconducting material and experience less mechanical stress during use.

However, in a magnet where field, amount of conductor and total force acting on the main coil are very high, excessive axial reduction or "squashing" of this coil would result in a need to have a large support plate positioned underneath the coil to provide axial structural support. The large radial size of this support plate would require a significant thickness to prevent sagging under the load, and would compromise the imaging gap. The aspect ratio of the main coil 40 should be optimized for a specific magnet from considerations of the amount of conductor, peak field, mechanical stresses and structural support required.

In FIG. 6, it is preferable to maintain the ratio of dimension 84 to dimension 80 greater than or equal to 1.0. In FIG. 7, this ratio is preferably greater than or equal to 2.0 and in FIG. 8, greater than or equal to 4.0. Such axially flattened main coils can be used in either one or both enclosures 12, 14.

Figure 9:
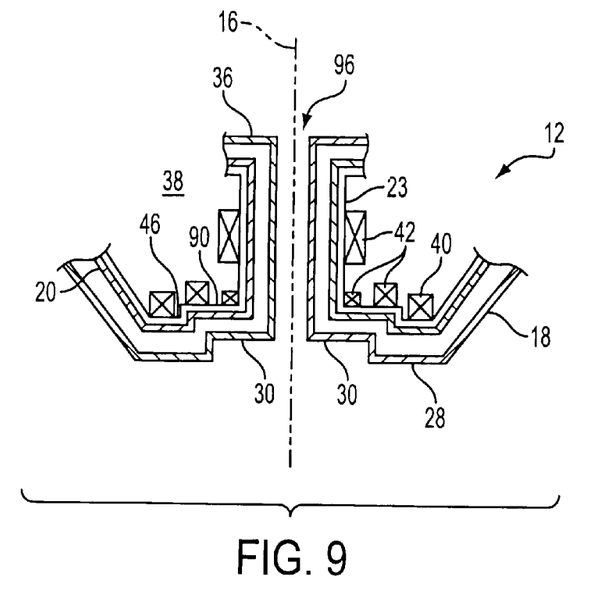
FIG. 9 is a partial view of one of the enclosures of FIG. 1 modified to include a central bore or chimney and showing several field shaping coils mounted directly on a recessed portion of an inner helium vessel wall.

Another refinement of the invention is shown in FIG. 9, wherein one or all of the field shaping coils 42 are arranged directly on or closely axially spaced from an inner plate 90 which forms a central axially stepped platform. A central bore or chimney 96 may be formed through chamber 38 from recess 30 to end face 36, to improve openness and air circulation and provide further design benefits noted below. Chimney 96 can be formed in one or both enclosures 12, 14.

Plate 90 is located in chamber 38 over recess 30 and forms that portion of the inner envelope 20 of the helium vessel juxtaposed and bordering pole 28. The intent is to maintain the minimum axial position of each field shaping coil 42 from the center of gap 24 substantially the same. This results in a planetary or substantially radially coplanar arrangement of the field shaping coils and in turn requires a minimum amount of superconducting material in the field shaping coils.

However, some coils 42 cannot be wound on-line in the same axial plane on a single mandrel, as they get in the way of the winding of other coils during the winding process. Such coils have to be wound off-line and then mounted inside the helium vessel. Winding on-line is preferable from the manufacturing standpoint. It also generally provides better alignment which yields a better field uniformity.

To facilitate this, one or more of the field shaping coils 42 in one or both of the enclosures 12, 14 are shifted axially from the center with respect to each other, thus creating an axially stepped arrangement where each field shaping coil 42 is not in the way of the other field shaping coils during the winding process. Since in the stepped arrangements some coils are moved further axially from the gap, more conductor is required than in the planetary design. Choice between the two implementations would depend on the trade-off between cost, manufacturability and uniformity requirements for a specific design.

Figure 10:
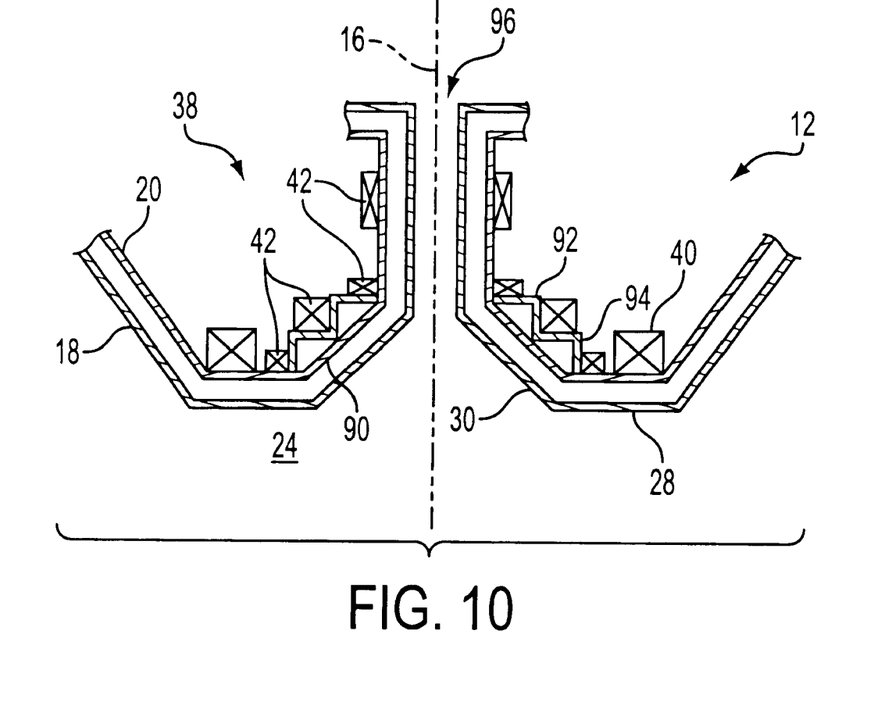
FIG. 10 is a view similar to FIG. 9 showing several field shaping coils mounted and wound around an axially and radially stepped mandrel.

Such a stepped arrangement is shown in FIG. 10 where the field shaping coils 42 are shown wound on a single annular stepped coil form or mandrel 92. As further seen in FIG. 10, one (or more) of the field shaping coils 42 can be mounted in pocket 46, radially outwardly of conical recess 30. This location of coil 42 requires less superconducting material than if located more radially inwardly over recess 30. Mandrel 92 can be formed as part of vessel wall 20 as shown in FIGS. 4, 5, and 11, or as a separate insert 94 mounted on wall 20, as seen in FIG. 10.

Figure 11:
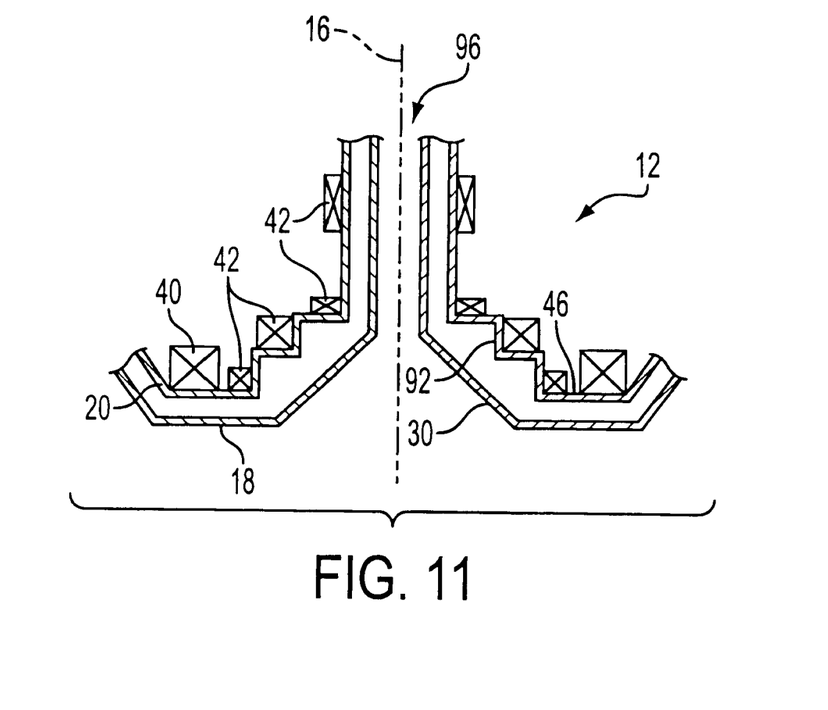
FIG. 11 is a view similar to FIG. 10 showing the formation of an axially and radially stepped mandrel formed with a central inner bore or tube used for winding of small radius coils within a helium vessel.

The axially extending open tube or chimney 96 communicating with recess 30 can be formed in the helium vessel and vacuum vessel, as shown in FIG. 11. This chimney 96 can be incorporated into any of the designs discussed above, and can be used for electrical cable connections and other purposes of MRI systems.

There has been disclosed heretofore the best embodiment of the invention presently contemplated. However, it is to be understood that the various changes and modifications may be made thereto without departing from the spirit of the invention.

What is claimed is:

1. A split type superconducting magnet assembly, in particular for MRI imaging, comprising:
   an enclosure comprising a pole surface, a side wall extending from said pole surface and an outer end surface connected to said side wall;
   a superconducting main coil disposed in said enclosure adjacent said pole surface, said main coil having an inner diameter and an outer diameter; a primary shield coil disposed in said enclosure between said main coil and said outer end surface,
   said primary shield coil having an outer diameter larger than said outer diameter of said main coil and carrying current in a direction opposite to that of said main coil;
   and a plurality of field shaping coils disposed adjacent said pole surface, each of said field shaping coils having an outer diameter less than the inner diameter of said main coil and axially disposed coplanar with said main coil or between said main coil and said shield coil, each of said field shaping coils having a predetermined location and magnetic polarity.

2. The assembly of claim 1, wherein said side wall comprises a cylindrical wall portion extending from a frustoconical wall portion.

3. The assembly of claim 1, wherein said pole surface has a recess formed therein.

4. The assembly of claim 3, wherein said recess and said side wall define an annular pocket, and wherein said main coil is disposed in said annular pocket.

5. The assembly of claim 4, further comprising at least one field shaping coil disposed in said annular pocket.

6. The assembly of claim 1, wherein said shield coil is mounted in said enclosure adjacent a corner formed between said side wall and said outer end surface.

7. The assembly of claim 1, wherein said side wall comprises a central substantially cylindrical wall portion and a pair of substantially frustoconical wall portions connected to said cylindrical wall portion.

8. The assembly of claim 7, wherein said shield coil is mounted adjacent said cylindrical wall portion.

9. The assembly of claim 1, wherein said side wall comprises a first cylindrical side wall extending from said pole surface and a second cylindrical side wall located radially outwardly from said first cylindrical side wall.

10. The assembly of claim 9, wherein said shield coil is mounted adjacent said second cylindrical side wall.

11. The assembly of claim 10, wherein said second cylindrical side wall forms an annular channel with said outer end surface and wherein said shield coil is disposed in said annular channel.

12. The assembly of claim 1, wherein said plurality of field shaping coils is arranged along a common radial plane.

13. The assembly of claim 12, wherein said enclosure comprises a helium vessel and wherein said common radial plane is defined by an inner wall of said helium vessel.

14. The assembly of claim 13, further comprising a plurality of coil winding supports mounted adjacent said inner wall.

15. The assembly of claim 1, further comprising an axially stepped platform located within said enclosure adjacent said pole surface, and at least one field shaping coil mounted adjacent said platform.

16. The assembly of claim 15, wherein said main coil surrounds said platform.

17. The assembly of claim 15 further comprising a plurality of field shaping coils mounted on said platform.

18. The assembly of claim 1, further comprising an axially and radially stepped mandrel mounted in said enclosure and a plurality of axially spaced field shaping coils mounted on said mandrel.

19. The assembly of claim 1 wherein said enclosure comprises an outer vacuum vessel and ferromagnetic shielding elements provided as part of said outer vacuum vessel, providing additional shielding of stray field.

20. The assembly of claim 1, wherein said enclosure comprises a vacuum vessel and ferromagnetic shielding elements mounted outside of said vacuum vessel, providing additional shielding of stray field.

21. The assembly of claim 1, further comprising at least one secondary shield coil disposed in said enclosure.

22. The assembly of claim 21, wherein said secondary shield coil carries current in a direction opposite to that of said primary shield coil.

23. The assembly of claim 21, wherein said secondary shield coil has an outer diameter greater than the outer diameter of said main coil.

24. The magnet assembly of claim 1 wherein the field shaping coils are axially disposed between the main coil and the shield coil.

25. The magnet assembly of claim 1 wherein the magnetic polarity of at least one of the field shaping coils is opposite to that of the main coil.

26. The magnet assembly of claim 1 wherein at least one of the field shaping coils is axially disposed coplanar with the main coil.

27. The magnet assembly of claim 1 further comprising a central chimney bore in the enclosure.

28. The magnet assembly of claim 1 wherein the axial dimension of the main coil is less than the radial dimension of the main coil.

29. The magnet assembly of claim 1 further comprising a dedicated structural element, to which one or more of the field shaping coils with their corresponding mandrels are mounted after being wound off-line.

* * * * *